(12) United States Patent
Shida et al.

(10) Patent No.: US 8,410,501 B2
(45) Date of Patent: Apr. 2, 2013

(54) LIGHT SOURCE

(75) Inventors: Satoshi Shida, Osaka (JP); Hiroyuki Naito, Osaka (JP); Takaari Uemoto, Osaka (JP)

(73) Assignee: Panasonic Corporation, Osaka (JP)

( * ) Notice: Subject to any disclaimer, the term of this patent is extended or adjusted under 35 U.S.C. 154(b) by 956 days.

(21) Appl. No.: 12/519,506

(22) PCT Filed: Jan. 10, 2008

(86) PCT No.: PCT/JP2008/050559
§ 371 (c)(1),
(2), (4) Date: Jun. 16, 2009

(87) PCT Pub. No.: WO2008/084878
PCT Pub. Date: Jul. 17, 2008

(65) Prior Publication Data
US 2009/0321772 A1 Dec. 31, 2009

(30) Foreign Application Priority Data
Jan. 11, 2007 (JP) .................................. 2007-003881

(51) Int. Cl.
*H01L 33/00* (2010.01)
(52) U.S. Cl. .................................. 257/98; 257/E33.056
(58) Field of Classification Search ........... 257/E33.056, 257/98
See application file for complete search history.

(56) References Cited

U.S. PATENT DOCUMENTS

| | | | |
|---|---|---|---|
| 7,629,620 B2 * | 12/2009 | Maeda et al. .................. 257/98 |
| 2002/0175621 A1 | 11/2002 | Song et al. | |
| 2004/0027067 A1 | 2/2004 | Song et al. | |
| 2004/0065894 A1 | 4/2004 | Hashimoto et al. | |
| 2005/0225222 A1 * | 10/2005 | Mazzochette et al. .......... 313/46 |
| 2005/0248259 A1 | 11/2005 | Chang | |
| 2006/0255352 A1 | 11/2006 | Lin et al. | |

FOREIGN PATENT DOCUMENTS

| | | | |
|---|---|---|---|
| CN | 1466782 | 1/2004 | |
| EP | 1 681 728 | 7/2006 | |
| EP | 1681728 | * 7/2006 | ...................... 257/98 |
| JP | 2002-353515 | 12/2002 | |
| JP | 2005-294185 | 10/2005 | |
| WO | 2004/099342 | 11/2004 | |

OTHER PUBLICATIONS

Chinese Patent Application No. 200880002090.0 Office Action, dated Apr. 28, 2012 (with English translation) 11 pages.

* cited by examiner

*Primary Examiner* — Stephen W Smoot
*Assistant Examiner* — Vicki B Booker

(57) ABSTRACT

A light source that restricts the heat accumulation in the phosphor. The light source includes: a substrate 5; LED elements D21, D22, D23, D41, D42 that have been implemented on a main surface of the substrate 5; projections 11 that have been formed in areas of the main surface of the substrate 5 in which any of the LED elements D21, D22, D23, D41, D42 have not been implemented; and a translucent sealing member 7 that has been formed on the substrate in a state that the LED elements D21, D22, D23, D41, D42 and the projections 11 are covered and sealed with the sealing member 7. The sealing member 7 includes a phosphor 13 that converts light from the LED elements D21, D22, D23, D41, D42 into light of a predetermined color. The heat conductivity of the projections 11 is higher than the heat conductivity of the sealing member 7.

5 Claims, 11 Drawing Sheets

Temperature measurement results (°C)

| Measured location | Invention example | Comparative example 1 | Comparative example 2 |
|---|---|---|---|
| L4 | 79 | 79 | 79.2 |
| L3 | 70.1 | 69.1 | 73.3 |
| L2 | 63.5 | 63.4 | 64.2 |
| L1 | 50.5 | 50.3 | 51.4 |

Comparative example 1 · · · No phosphor, no projection
Comparative example 2 · · · Phosphor contained, no projection

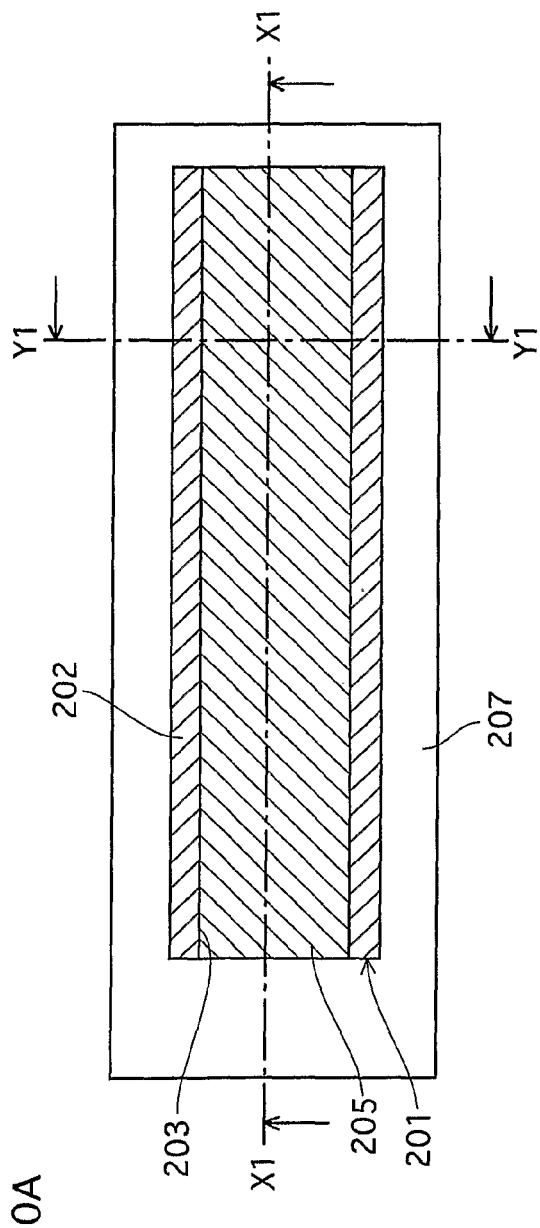
FIG.10A
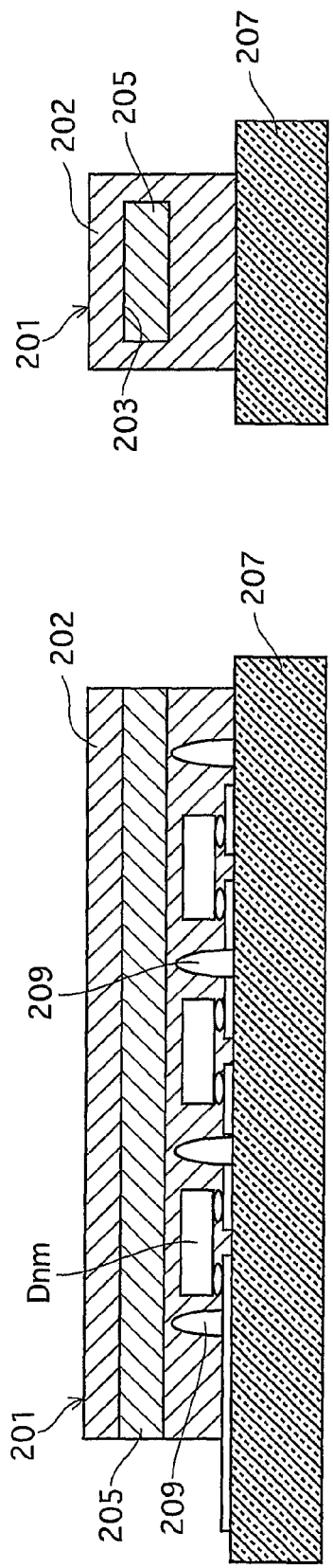
FIG.10B
FIG.10C

LIGHT SOURCE

CROSS-REFERENCES TO RELATED APPLICATIONS

This application is a National Stage application of PCT/JP2008/050559 filed on Jan. 10, 2008; and claims Foreign Priority benefit of JAPAN 2007-003881 filed Jan. 11, 2007.

TECHNICAL FIELD

The present invention relates to a light source in which semiconductor light emitting elements implemented on the substrate are covered and sealed with a sealing member.

BACKGROUND ART

There have been used light sources in which LED elements, which are one example of semiconductor light emitting elements for use therein, are used. Each of such light sources includes a substrate, LED elements implemented on a main surface of the substrate, and a translucent sealing member formed on the substrate to cover and seal the LED elements.

The sealing member is often made of resin that contains a phosphor that converts light emitted from the LED elements into light of a desired color.
<Document 1>
Japanese Patent Application Publication No. 2002-353515

DISCLOSURE OF THE INVENTION

The Problems the Invention Is Going to Solve

In the light source having the above-described structure, however, the phosphor accumulates heat that is generated as the thermal energy when the phosphor converts light emitted from the LED elements into light of a desired color. The heat increases the temperature of the sealing member, and increases the temperature of the LED elements covered and sealed with the sealing member. As a result, the light source of this structure has a problem that the light emitting efficiency of the LED elements is decreased by the temperature rise.

The object of the present invention is therefore to provide a light source that accelerates the release of heat from the sealing member.

Means to Solve the Problems

The above-described object is achieved by a light source comprising: a substrate; semiconductor light emitting elements that have been implemented on a main surface of the substrate; a translucent sealing member that includes a phosphor and is provided on the main surface of the substrate to cover and seal the semiconductor light emitting elements; and heat conductors that are provided on the main surface of the substrate as projections from the substrate in an area where the sealing member is provided, such that the heat conductors conduct heat from the sealing member to the substrate. With this structure, the heat is conducted from the sealing member to the substrate.

In the above-stated light source, the sealing member may include the phosphor and an inorganic material.

In the above-stated light source, the sealing member may include the phosphor and an organic material.

In the above-stated light source, the heat conductors may be tapered.

In the above-stated light source, an outer surface of each of the heat conductors may be a light reflection surface.

Effects of the Invention

According to the light source of the present invention, the sealing member has the heat conductor therein. With this structure, the heat accumulated in the phosphor is conducted to the heat conductor, and then conducted to the substrate. This makes it possible to accelerate the release of heat from the sealing member, restricting the temperature rise in the sealing member and the semiconductor light emitting elements. This prevents the light emitting efficiency of the semiconductor light emitting elements from decreasing.

BRIEF DESCRIPTION OF THE DRAWING

FIG. 10A is a cross sectional view of the first modification to the sealing member cut by a plane that is parallel to the substrate.

FIG. 10B is a cross sectional view taken along a line X1-X1 of FIG. 10A and viewed from a direction as indicated by the arrows nearby.

FIG. 10C is a cross sectional view taken along a line Y1-Y1 of FIG. 10A and viewed from a direction as indicated by the arrows nearby.

Figure 1:
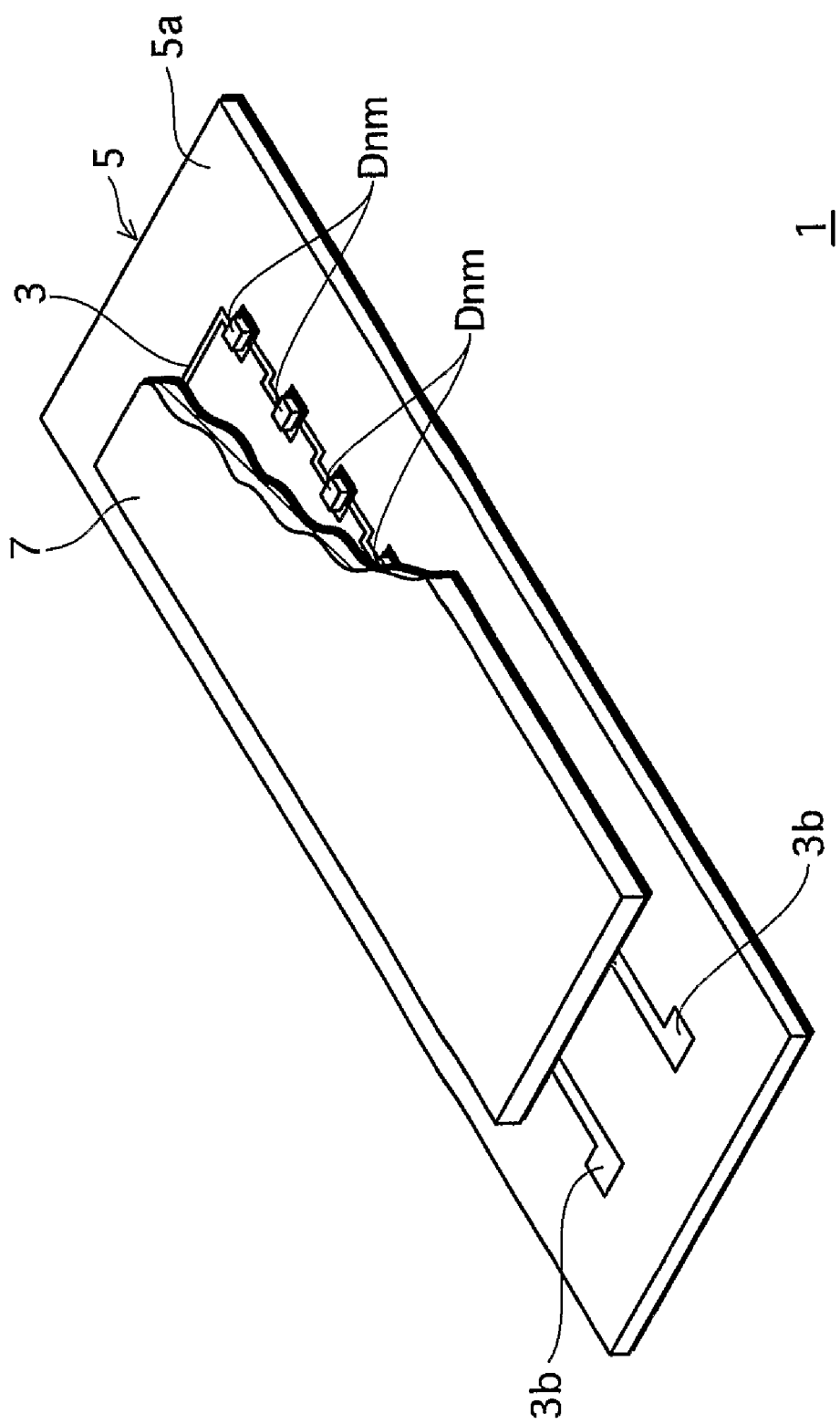
FIG. 1 is a perspective view of the light source in the present embodiment, which is partially cut away to show the inside.

DESCRIPTION OF CHARACTERS 1 light source
3 wiring pattern
5 substrate
7 sealing member
11 projection
13 phosphor
Dnm LED element

BEST MODE FOR CARRYING OUT THE INVENTION

The following describes a light source as an embodiment of the present invention, in which LED elements are used as semiconductor light emitting elements.

1. Overall Structure

FIG. 1 is a perspective view of the light source in the present embodiment, which is partially cut away to show the inside.

Figure 4:
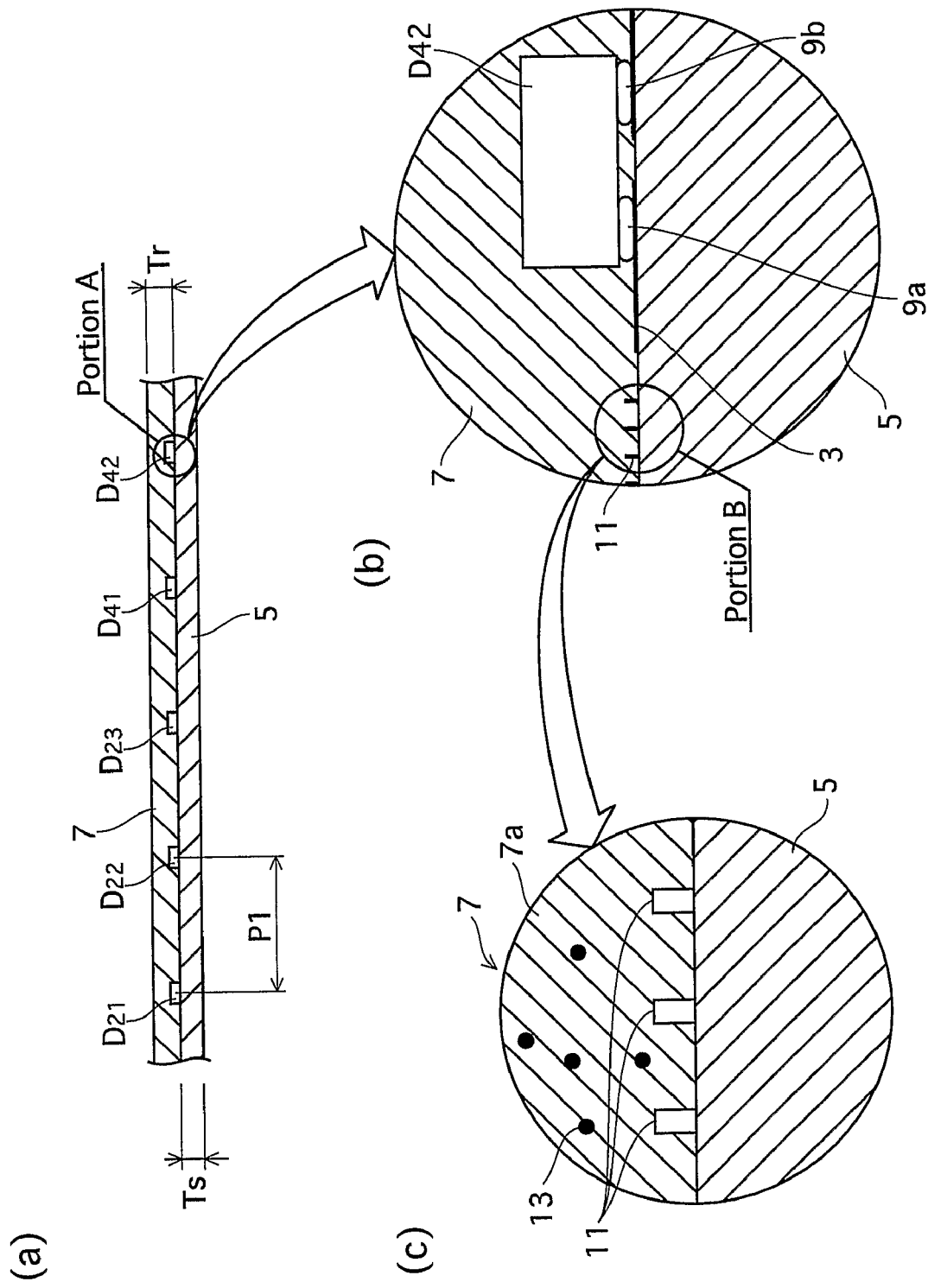
FIG. 4: the part (a) is a cross sectional view of the light source; the part (b) is an expansion of the portion A shown in the part (a); and the part (c) is an expansion of the portion B shown in the part (b).

As shown in FIG. 1 and FIG. 4, a light source 1 includes a substrate 5, a plurality of LED elements Dnm, a sealing member 7, and a plurality of projections (heat conductive members) 11. The substrate 5 includes a wiring pattern 3 formed on a main surface 5a. The plurality of LED elements Dnm are implemented on the main surface 5a of the substrate 5. The sealing member 7 is attached to the main surface 5a to cover and seal the plurality of LED elements Dnm. The plurality of projections 11 are formed on the main surface 5a of the substrate 5.

Figure 2:
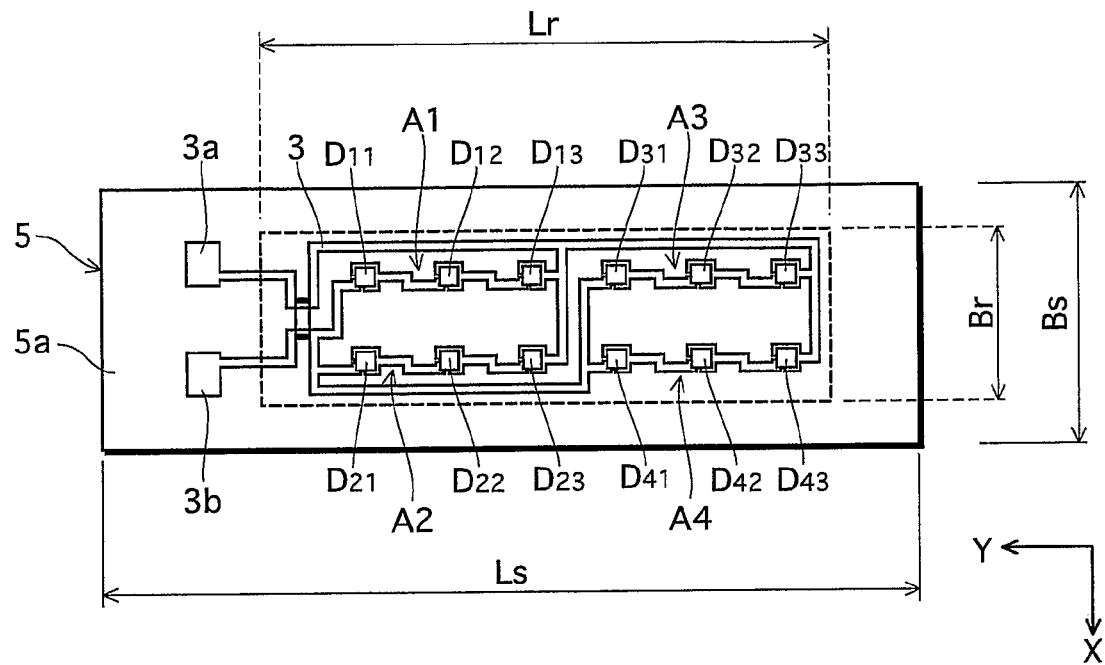
FIG. 2 is a plan view of the light source without the sealing member.
Figure 3:
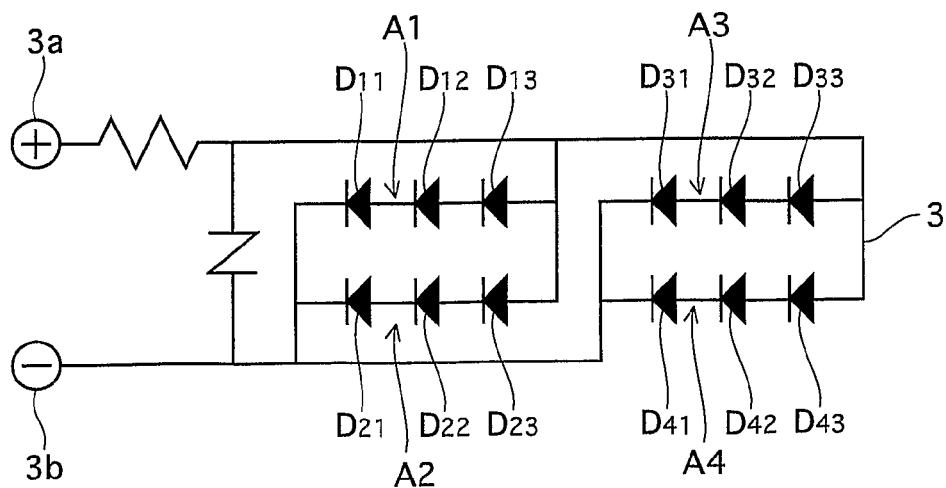
FIG. 3 is a circuit diagram of the light source.

FIG. 2 is a plan view of the light source without the sealing member. FIG. 3 is a circuit diagram of the light source.

As shown in FIG. 2 and FIG. 3, the light source 1 of the present embodiment includes 12 pieces of LED element Dnm. The LED element Dnm is electrically connected to the wiring pattern 3 which is composed of two power supply terminals, namely, power supply terminals 3a and 3b. Here, the power supply terminal 3a is, for example, a terminal on the positive electrode side, and the power supply terminal 3b is, for example, a terminal on the negative electrode side.

Each of the 12 pieces of LED element Dnm is connected such that four series groups An are connected in parallel with each other, where "n" is a natural number of 1 to 4. In each series group An, three LED elements are connected in series. Accordingly, "n" in Dnm identifies one of the series groups, and "m" in Dnm represents one of the three LED elements in a series group, starting from the LED element nearest to the power supply terminal 3b on the negative electrode side. For example, the LED elements constituting the second series group A2 are identified as "D21", "D22", and "D23".

It should be noted here that, when it is not necessary to identify the position of each LED element, each LED element is merely represented as "Dnm".

The part (a) of FIG. 4 is a cross sectional view of the light source. The part (b) of FIG. 4 is an expansion of the portion A shown in the part (a) of FIG. 4. The part (c) of FIG. 4 is an expansion of the portion B shown in the part (b) of FIG. 4.

As shown in the part (a) of FIG. 4, each LED element Dnm is implemented on the substrate 5 and covered by the sealing member 7. In this state, each LED element Dnm is hermetically sealed by the sealing member such that the LED element Dnm is neither exposed to nor in communication with an external air surrounding the sealing member 7.

Next, the implementation of the LED element Dnm will be described, using, as an example, an LED element D42 that is shown in the part (b) of FIG. 4. It should be noted here that the other LED elements Dnm are implemented in the same manner as the LED element D42.

The LED element D42 is a single surface electrode type in which both the P-type electrode and the N-type electrode are provided on the back surface. These electrodes are connected to and implemented onto the wiring pattern 3 by, for example, bumps 9a and 9b. It should be noted here that the LED element D42 is also connected to the main surface 5a of the substrate 5 by part of the bumps 9a and 9b that has run off the edge of the wiring pattern 3.

As shown in the part (c) of FIG. 4, a plurality of projections 11 are formed of the main surface 5a of the substrate 5 in areas in which no LED element Dnm is formed. The projections 11 project in a direction perpendicular to the main surface 5a. In other words, the projections 11 project in the vertical direction.

The sealing member 7 is formed as a mixture of an organic material, such as resin material 7a, and a phosphor 13. The phosphor 13 converts the light emitted from the LED elements Dnm into light of a desired color. Here, thermal energy is generated by the conversion of color to cause heat, and the phosphor 13 holds the generated heat. The heat is conveyed to the projections 11 in the vicinity of the phosphor 13, and then to the substrate 5. When the light source 1 is attached to a lighting instrument that, for example, includes a heat sink (and then the substrate 5 is in close contact with the heat sink), the heat is conveyed from the substrate 5 to the heat sink. This results in the release of the heat having been held by the phosphor 13.

It should be noted here that the light source may have a structure where the LED elements are implemented on one surface of the substrate, and a heat sink is provided on an opposite surface of the substrate.

2. Example

A specific example of the light source 1 having the above-described structure will be explained.

The substrate 5 is made of ceramic such as alumina, and has 37 [mm] of length Ls, 12 [mm] of width Bs, and 0.8 [mm] of thickness Ts (see FIG. 2 and the part (a) of FIG. 4). The wiring pattern 3 is formed on the main surface 5a of the substrate 5 to have a predetermined pattern by applying a sheet of copper foil with 10[μm] of thickness thereto by the etching method.

Each LED element Dnm is substantially in a shape of a rectangular parallelepiped, with its bottom being in a shape of a square of 0.8 [mm]×0.8 [mm], with its height being 0.31 [mm]. Each LED element Dnm is made of InGaN-based material. The color of the light emitted from the LED element Dnm is blue.

Used as the resin material 7a of the sealing member 7 is, for example, silicon resin. Also, used as the material of the phosphor 13 is, for example, a phosphor that emits yellow light. With this arrangement, the blue light emitted from the LED element Dnm is converted in color by the phosphor 13, and yellow light is emitted from the light source 1.

The sealing member 7 covers and seals all of the 12 pieces of LED element Dnm, the plurality of projections 11, and the wiring pattern 3, except for the power supply terminals 3a and 3b. The sealing member 7 has 26 [mm] of length Lr, 8 [mm] of width Br, and 1.5 [mm] of thickness Tr (see FIG. 2 and the part (a) of FIG. 4).

It is preferable that the phosphor in the sealing member has the following density: 8 [wt %] to 10 [wt %] (more preferably 9.1 [wt %]) for neutral white light; and 10.5 [wt %] to 12 [wt %] (more preferably 11.2 [wt %]) for warm white light. The reason that these values are preferable is that they can reduce the change over time for each of desired color temperature.

As shown in FIG. 2, the plurality of LED elements Dnm are arranged in two rows and six columns in appearance. The distance between two adjacent columns is represented as P1 and is approximately 3.8 [mm] (refer to the part (a) of FIG. 4), and the distance between two adjacent rows is represented as P2 and is approximately 3.8 [mm], where each of these distances is a distance between respective centers of the adjacent LED elements Dnm.

Figure 5:
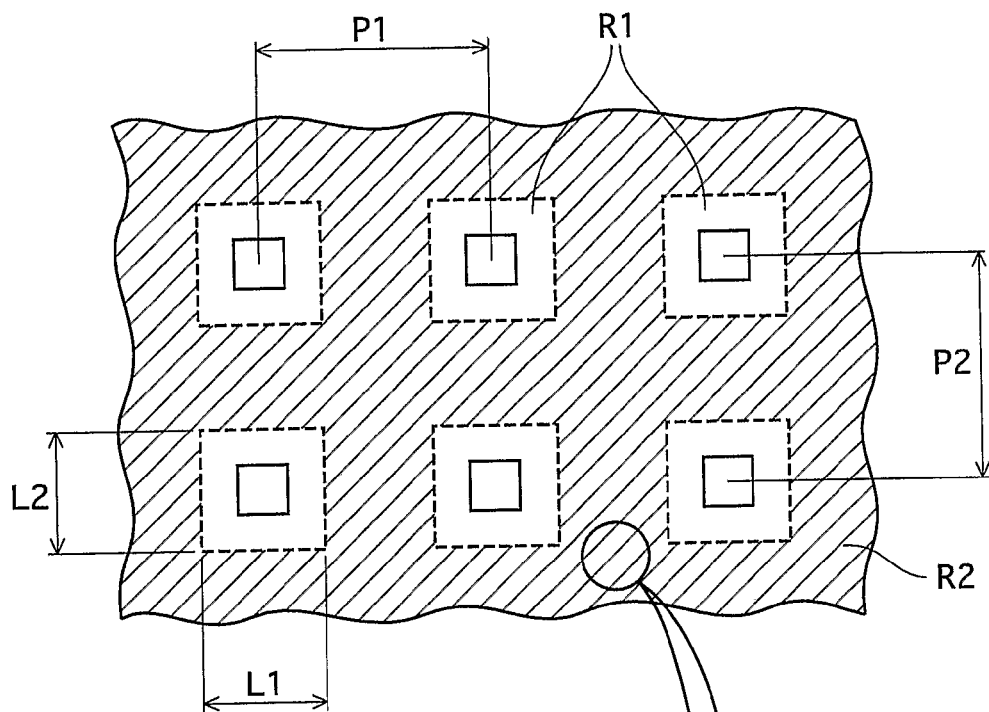
FIG. 5: the part (a) illustrates the arrangement of the projections; the part (b) is an expansion of a portion of the part (a) of FIG. 5; and the part (c) is a side view of the projection.
Figure 5:
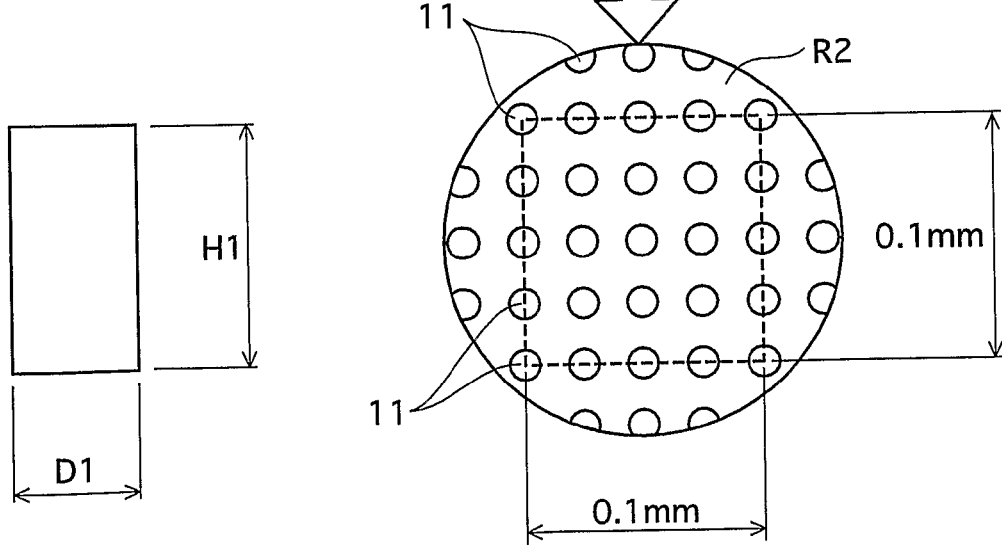

In FIG. 5, the part (a) illustrates the arrangement of the projections, the part (b) is an expansion of a portion of the part (a) of FIG. 5, and the part (c) is a side view of the projection.

The projections 11 are formed in the entire area of the main surface 5a, except for areas R1 which are each an area surrounding an LED element Dnm. The area in which the projections 11 are formed is represented as R2. Each area R1 is substantially in a shape of square, where the distance between a side of an LED element Dnm and a side of the surrounding area R1 that is opposite to the side of the LED element Dnm, in a plan view, is 0.5 [mm], and L1 and L2, which represent lengths of sides of each area R1 in different directions are each 1.8 [mm]. The reason that each area R1 is formed in a shape of square is to diffuse the heat uniformly.

As shown in the part (b) of FIG. 5, the projections 11 are formed in the area R2 such that each side of a square of 0.1 [mm]×0.1 [mm] in the area R2 has five projections 11, with respective centers of the projections being on each side of the square in a plan view. Namely, the formation density of the projections 11 can be defined as 17 pieces of projections per 0.01 [mm$^2$].

As shown in the parts (b) and (c) of FIG. 5, each of the projections 11 is cylindrical and has 10 [mm] of diameter D1, which is a diameter of the bottom (the circle in the cross section), and has 20 [mm] of height H1. The projections 11 are made of, for example, gold (Au).

The projections 11 are formed by applying the technology of forming bumps by the ink jet method. The heat conductivity of the projections 11 is 290 [W/m·K], and the heat conductivity of the sealing member 7 is 0.83[W/m·K] to 4 [W/m·K].

3. Experiment Results

The temperature of the light source was measured when the light source was laid on a heat sink (15) and all the LED elements Dnm were lighted.

Figure 6:
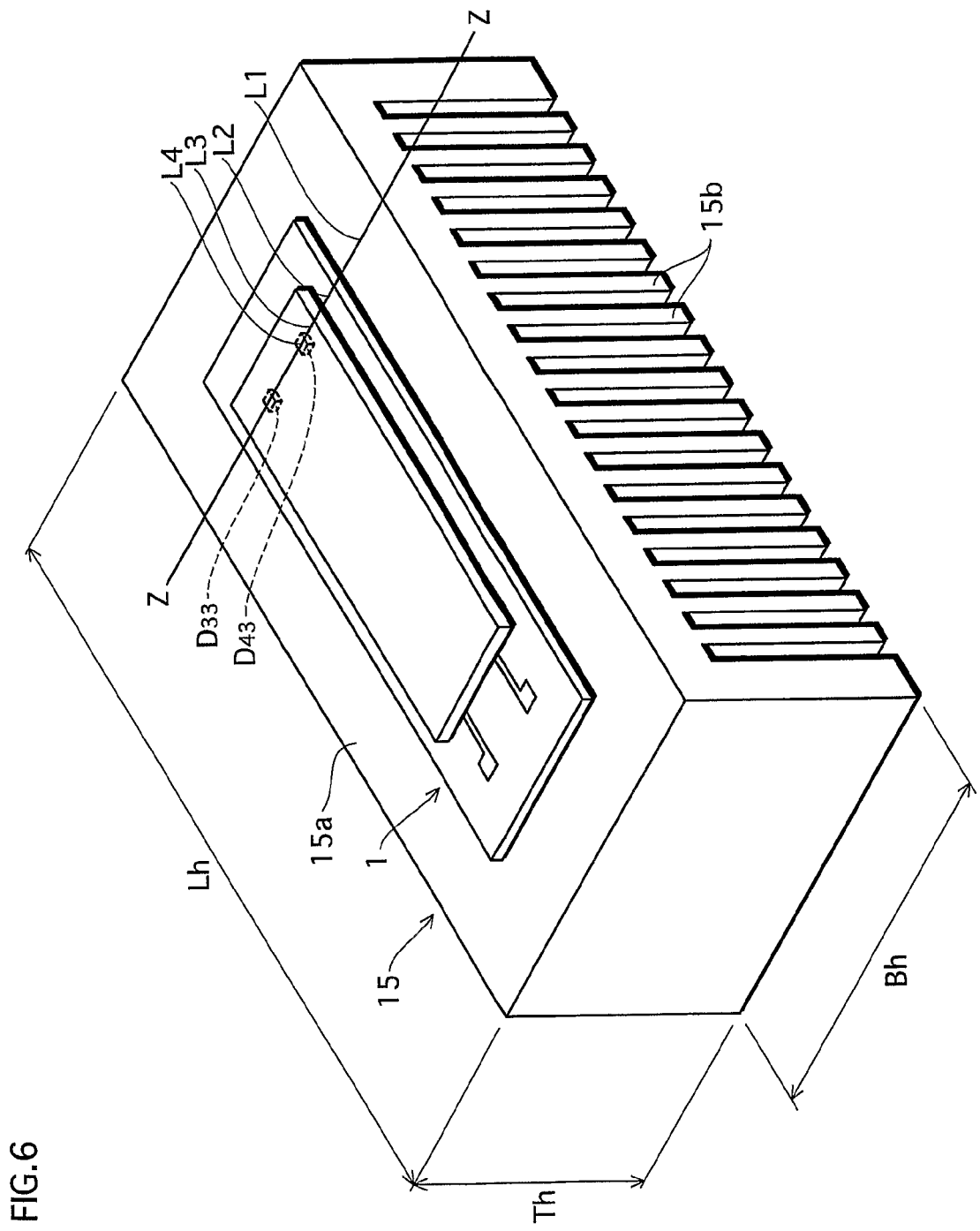
FIG. 6 illustrates the structure when the temperature is measured.

FIG. 6 illustrates the structure when the temperature was measured.

A heat sink 15 is substantially in a shape of a rectangular parallelepiped, which is 50 [mm] in length (Lh), 25 [mm] in width (Bh), 15 [mm] in thickness (Th), and 54 [cm$^3$] in volume. The heat sink 15 is made of an aluminum material such as an aluminum material plated with white/black alumite. The heat sink 15 includes fins 15b for releasing heat on a side thereof that is opposite to a placement surface 15a thereof on which the light source 1 is laid.

While the light source 1 is laid on substantially the center of the placement surface 15a of the heat sink 15, 800 [mA] of current in total is applied such that 200[mA] of current flows in each series group An. The application voltage for applying the current is 10.5[V].

The temperature was measured at four locations on a line Z-Z connecting the centers of two LED elements (in this example, D33 and D43) that are adjacent in the column direction (in the X direction in FIG. 2). The four measurement locations are: L1 that is located on the heat sink 15 and is outside the light source 1; L2 that is located on the substrate 5 and is outside the sealing member 7; L3 that is located on the sealing member 7 and is outside a portion on which the LED element D43 is implemented; and L4 that is located on the LED element D43.

The temperature was measured at the measurement locations L1 to L4 using a contactless thermometer, and the measurement was performed after a lapse of 30 seconds after all the LED elements Dnm started to be lighted.

The examples of the light source used in the measurement are divided into three types: an example of the light source 1 (herein after referred to as "invention example") that has the structure of the present invention as described in the embodiment above; an example (herein after referred to as "comparative example 1") that has the structure of the light source 1 except that the sealing member is made of merely resin (not containing a phosphor) and that the projections have not been made; and an example (herein after referred to as "comparative example 2") that has the structure of the light source 1 except that the projections have not been made.

Figures 7A, 7B:
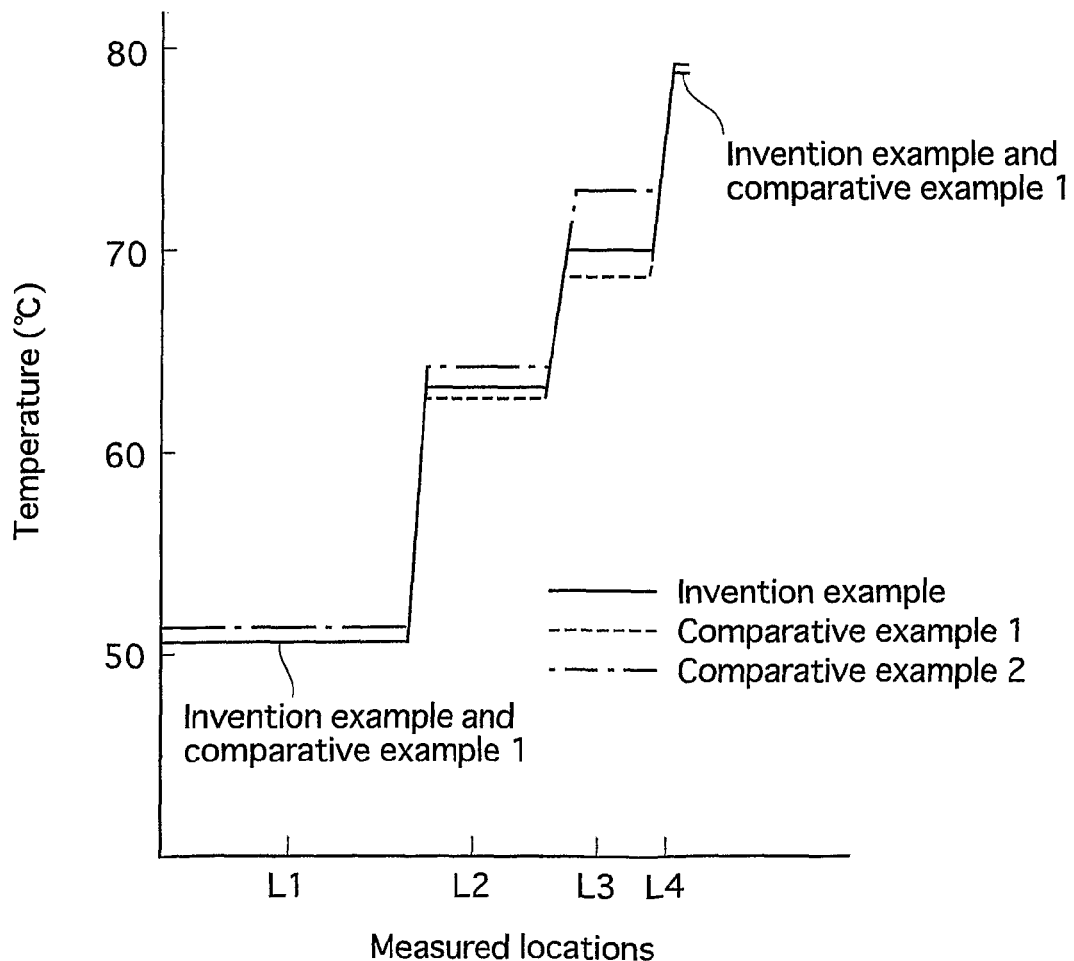
FIG. 7A shows the temperature measurement results with regard to the invention example and the comparative examples.
FIG. 7B is a graph of the temperature measurement results.

FIG. 7A shows the temperature measurement results with regard to the invention example and the comparative examples. FIG. 7B is a graph of the temperature measurement results.

It is found from the comparison between the measurement results of the comparative examples 1 and 2 that the comparative example 2 has higher values of measured temperature than the comparative example 2 at all of the measurement locations L1 to L4.

It is considered that this is because the comparative example 2 contains the phosphor 13 within the sealing member 7, and thus the phosphor 13 holds heat when it converts light received from the LED elements Dnm into light of a desired color (thermal energy is generated by the conversion of color, and the heat of the thermal energy remains in the sealing member), while the comparative example 1 does not contain the phosphor that performs the conversion, and thus the thermal energy is not generated by the conversion of color.

On the other hand, it is found from the comparison between the measurement results of the invention example and the comparative example 1 that they show substantially the same temperature distribution at all the measurement locations L1 to L4, except for a slight temperature difference at measurement location L3. The comparative example 1 does not contain the phosphor, while the invention example includes the sealing member 7 that contains the phosphor 13. It is derived from this that the projections 11 formed on the substrate 5 released the remaining heat from the sealing member 7 completely in substance, so that the invention example with the phosphor and the comparative example 1 without the phosphor had substantially the same temperature distribution.

The light emitting efficiency of the comparative example 2 was approximately 39 [lm/W], while the light emitting efficiency of the invention example having the projections 11 was approximately 47 [lm/W], indicating that the invention example has been improved from the comparative example 2 by approximately 20[%] in the light emitting efficiency.

4. Projections (1) Shape

The projections 11 in the present embodiment are formed in the shape of a cylinder by applying the technology of forming bumps by the ink jet method. However, not limited to this, the projections may be formed in other shapes.

That is to say, the projections 11 may be formed in the shape of a quadrangular prism. Also, the projections 11 may be formed in the shape of a triangular prism, a pentagonal prism, or a prism having six or more angles. Further, the projections may be formed in the shape of a column whose cross-sectional surface has an ellipsoidal shape.

Still further, the projections 11 may be formed in the shape of a cone whose head has been cut off. Also, the projections 11 may be formed in the shape of a pyramid whose head has been cut off, where a cross-sectional surface of the pyramid has a shape of a quadrangle, triangle, or pentagon, or has six or more angles. Still further, the projections 11 may be formed in the shape of an elliptical cone whose head has been cut off, where across-sectional surface of the elliptical cone has an ellipsoidal shape. Still further, the projections 11 may be formed in a variety of shapes, on the substrate.

(2) Size

The projections 11 in the present embodiment have the shape of a cylinder, and have 10 [μm] of diameter D1, which is a diameter of the circle, the shape of a cross-sectional surface, and has 20 [μm] of height H1 (see the part (c) of FIG. 5). The size of the projections 11 is not limited to this. However, it is preferable that the cross-sectional surface of the projections 11 is, in size, inside a square whose one side is 5 [μm] to 10 [μm] long, and that the projections 11 are, in height, in a range from 5 [μm] to 20 [μm]. The reason that these ranges are preferable is that the projections 11 in these ranges can be formed easily by the ink jet method.

When the projections 11 have the shape of a cone whose head has been cut off, or a pyramid whose head has been cut off, it is preferable that the top surface is, in size, inside a square whose one side is 5 [mm] long. This is because it provides an excellent formability.

Further, the projections 11 may be formed in a variety of sizes, on the substrate.

(3) Density

In the present embodiment, the projections 11 are formed uniformly in substance on the substrate 5, and more specifically, 17 pieces of projections per 0.01 [mm$^2$] are formed. Here, the number of projections per unit area is determined appropriately depending on their size and/or the density of the LED elements Dnm. It is preferable that the number of projections per 0.01 [mm$^2$] is 100 or less.

The reason is that the projections can be formed such that the projections do no interfere with each other, and such that a broad surface area can be ensured with respect to the projections as a whole.

In the present embodiment, the projections are arranged uniformly. However, the projections may be arranged non-uniformly as a whole such that the projections are concentrated in a certain area.

(4) Arrangement

In the present embodiment, the projections 11 are arranged such that they surround each LED element Dnm completely. However, there is no need for the projections to surround each LED element Dnm completely, but they need to be arranged around each LED element. The projections may be arranged such that they surround each set of a plurality of adjacent LED elements (for example, two adjacent LED elements) completely. It is needless to say that the heat releasability is higher when the projections are arranged to surround each LED element Dnm completely, than the other projection arrangement methods.

(5) Others

In the present embodiment, the projections 11 are formed by the ink jet method. However, the projections 11 may be formed using a technology of forming stud bumps.

Figure 8:
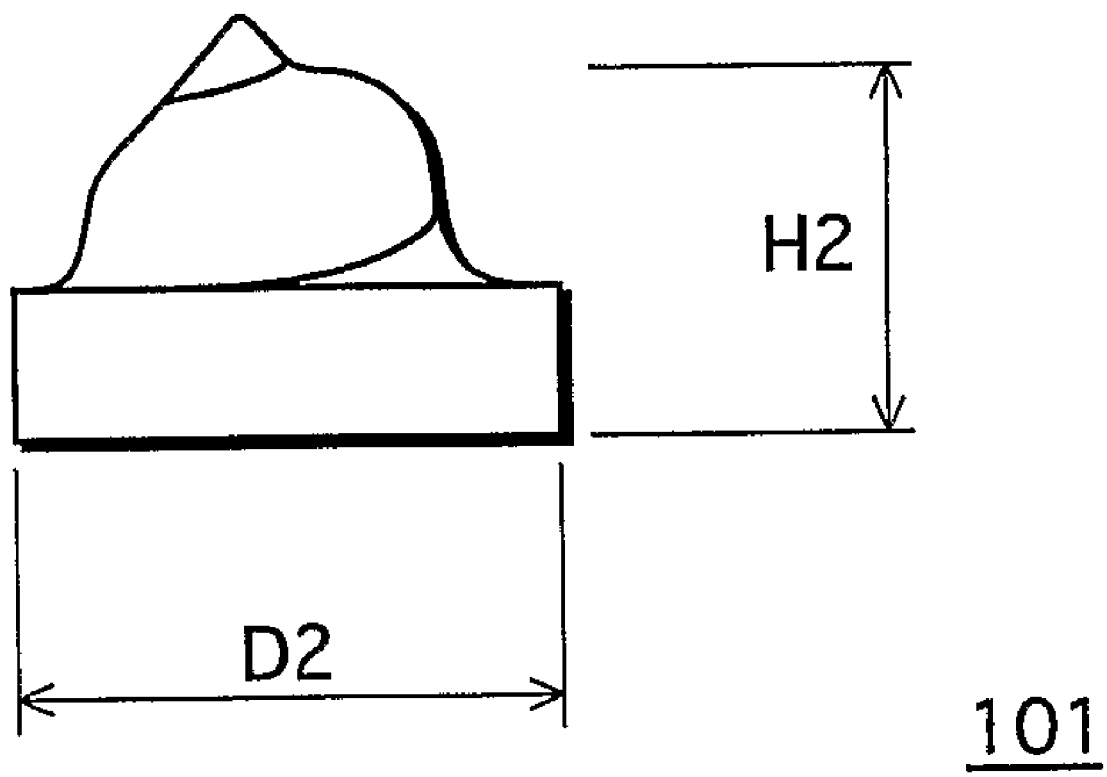
FIG. 8 shows a projection in which the stud bump is used.

FIG. 8 shows a projection in which the stud bump is used.

A projection 101, as shown in FIG. 8, is a typical stud bump. It is desirable that the stud bump has the following measurements that are determined from the forming technology: diameter D2 in the cross sectional shape is in a range from 60 [μm] to 100 [/μm], for example, 80 [μm]; and height H2 is in a range from 50 [μm] to 80 [μm], for example, 65 [μm].

The above-described measurements are desirable for the following reasons. That is to say, when it is taken into consideration that a ball whose diameter is three times that of a wire (for example, for a wire having 18 [μm] of diameter, the ball should have approximately 60 [μm] of diameter) is formed first, and the ball is transformed into the shape of a stud bump having a diameter larger than that of the ball, it is considered easy to form stud bumps having the above-described measurements.

It is further desirable that, in terms of the density of the projections 101, approximately 100 pieces or less of projections 101 are arranged per 1 [mm$^2$]. The reason is that the projections can be arranged not to interfere with each other, and that a broad surface area can be ensured with respect to the projections as a whole.

Up to now, the present invention has been described through an embodiment thereof. However, the present invention is not limited to the embodiment, but includes the following modifications for example, and may be achieved as any combination of the embodiment and the following modifications.

1. Semiconductor Light Emitting Element

In the above-described embodiment, LED elements are used as the semiconductor light emitting elements. However, other semiconductor light emitting elements, such as semiconductor laser, may be used instead.

Further, the arrangement and number of the semiconductor light emitting elements, the distance between adjacent semiconductor light emitting elements ("P1", "P2" shown in the part (a) of FIG. 5), and the like are not limited to those specified in the embodiment.

2. Heat Conductivity

In the above-provided embodiment, the projections as heat conductors are explained with respect to their shape, size, and formation method. Not limited to these, heat conductors of two shapes, for example cylinder and cone, may be used in combination.

Further, the heat conductor may be made of gold (Au), silver (Ag), copper (Cu), or the like, and may be formed to be tapered such that the outer surface of the heat conductor has a function of a light reflection surface that reflects light, which may be light from the semiconductor light emitting element or may be light from the phosphor after the conversion therein, toward the outside of the sealing member.

In the embodiment or the modification, a plurality of heat conductors, each having a shape of a projection, are used. However, a plurality of heat conductors may be formed in a shape of a block, bar, plate or the like, to project from the substrate to be present between the semiconductor light emitting elements implemented on the substrate.

Figure 9A:
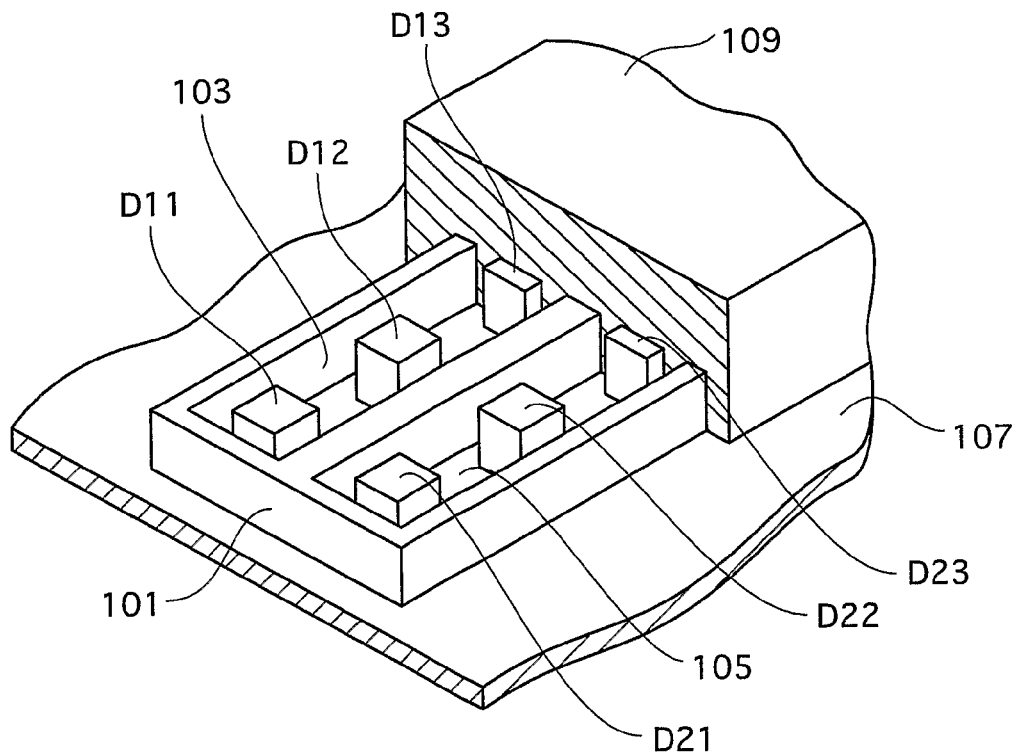
FIG. 9A shows a modification to the heat conductor.
Figure 9B:
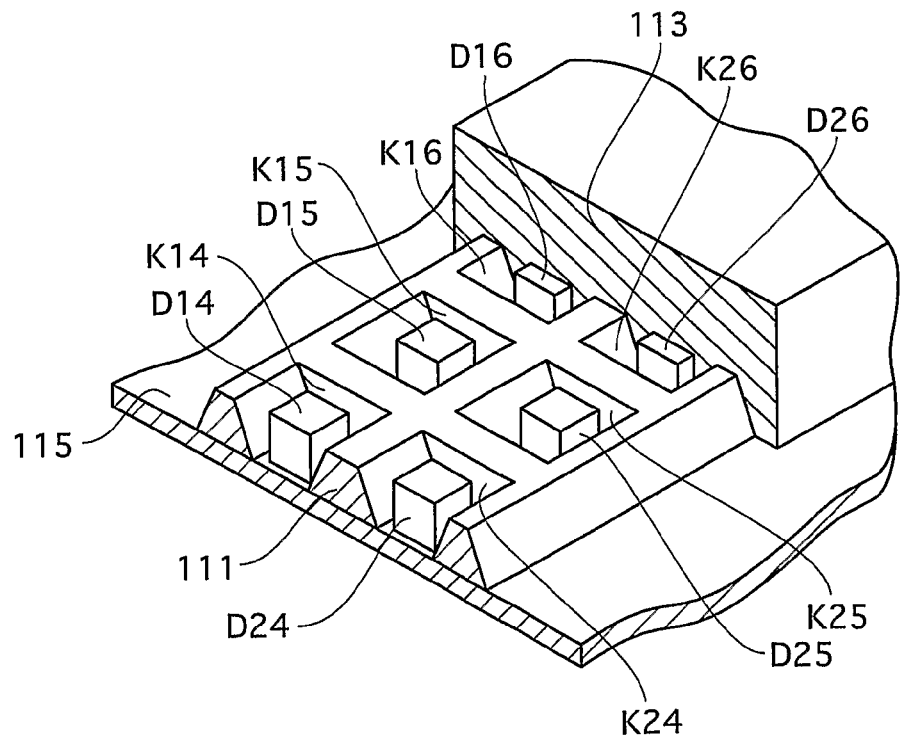
FIG. 9B shows another modification to the heat conductor.

FIGS. 9A and 9B show modifications of the heat conductor.

FIG. 9A shows a heat conductor 101 which is in the shape of a flat plate as a whole, and has holes 103 and 105 each of which corresponds in position to a series of semiconductor light emitting elements Dnm when the heat conductor 101 is attached to the substrate 107.

In this example, there are two holes 103 and 105, where, when the heat conductor 101 is attached to the main surface of the substrate 107, the hole 103 contains semiconductor light emitting elements D11 through D16, and the hole 105 contains semiconductor light emitting elements D21 through D26. It should be noted here that the semiconductor light emitting elements and the heat conductors are covered and sealed by a sealing member 109 that contains the phosphor. It should also be noted here that FIG. 9A only shows semiconductor light emitting elements D11 through D13 and D21 through D23 in this cut away view, and the remaining semiconductor light emitting elements D14 through D16 and D24 through D26 exist in the sealing member 109.

FIG. 9B shows a heat conductor 111 that surrounds each semiconductor light emitting element Dnm. The heat conductor 111 is in the shape of a flat plate as a whole, and has holes Knm each of which, when the heat conductor 111 is attached to a substrate 115, corresponds in position to a semiconductor light emitting element Dnm ("n" and "m" are natural numbers, and "n" and "m" in both holes Knm and semiconductor light emitting elements Dnm correspond to each other in terms of their positions). It should be noted here that the semiconductor light emitting elements and the heat conductors are covered and sealed by a sealing member 113 that contains the phosphor. It should also be noted here that FIG. 9B only shows semiconductor light emitting elements D14 through D16 and D24 through D26 in this cut away view, and the remaining semiconductor light emitting elements D11 through D13 and D21 through D23 are not shown for the sake of convenience.

The heat conductors shown in FIGS. 9A and 9B are single flat plates, respectively. However, not limited to this: a plurality of flat plates each of which has a plurality of holes at certain positions may be used; or a plurality of flat plates each of which has a hole may be used.

Also, each hole may be formed such that the opening of the hole (the area of a cross sectional plane of the hole) becomes wider as the opening is distanced away from the substrate, and such that the hole is surrounded by a reflection surface or a reflection film.

In these examples, the height of the heat conductor from the substrate is substantially the same as the height of the semiconductor light emitting element. However, not limited to this, the height of the heat conductor from the substrate may be larger or smaller than the height of the semiconductor light emitting element.

3. LED Element

The above-described embodiment adopts a method in which LED elements, as the semiconductor light emitting elements, are directly implemented onto the substrate. Not limited to this, however, it is possible to adopt another method where what is called a submount, in which the semiconductor light emitting elements have been implemented onto a sub-substrate, is implemented onto the (main) substrate.

In the embodiment, specification of the semiconductor light emitting elements is not provided. However, the present invention is not limited by the specification of the semiconductor light emitting elements. Also, the present invention is not limited to any colors of light emitted by the light emitting elements. For example, semiconductor light emitting elements emitting red light may be used. As an alternative to this, semiconductor light emitting elements emitting blue light may be used and the semiconductor light emitting elements may be covered and sealed with a resin (sealing member) that contains a phosphor that converts the blue light emitted from the semiconductor light emitting elements into another color of light.

Further, elements other than LED elements, such as laser diode elements, may be used as the semiconductor light emitting elements. The alternative element needs not be limited to a specific color of light, a specific size or the like.

4. Sealing Member

In the above-described embodiment, silicon resin is used as the sealing member. However, not limited to this, other resins, such as epoxy resin, may be used. As a further alternative, inorganic materials such as glass (low melting point glass) may be used. However, the sealing member should be made of a material that has translucency for transmitting the light emitted from the semiconductor light emitting elements.

Further, the sealing member may have a mechanism inside for releasing the heat generated by the semiconductor light emitting elements.

FIGS. 10A through 12C show modifications of the sealing member.

FIG. 10A is a cross sectional view of the first modification to the sealing member cut by a plane that is parallel to the substrate. FIG. 10B is a cross sectional view taken along a line X1-X1 of FIG. 10A and viewed from a direction as indicated by the arrows nearby. FIG. 10C is a cross sectional view taken along a line Y1-Y1 of FIG. 10A and viewed from a direction as indicated by the arrows nearby.

Figure 11A:
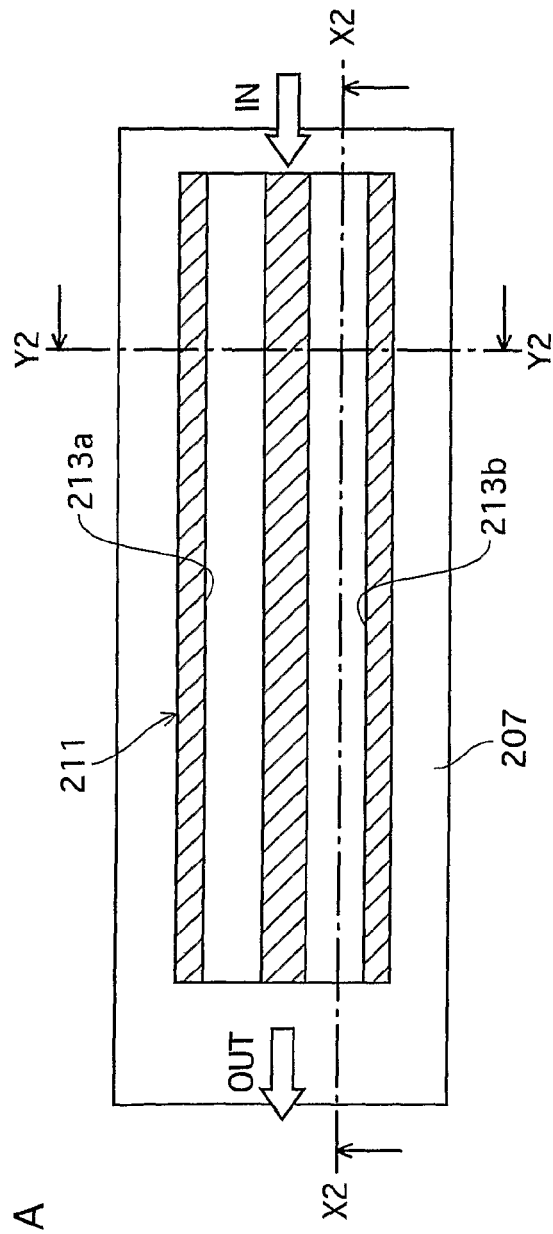
FIG. 11A is a cross sectional view of the second modification to the sealing member cut by a plane that is parallel to the substrate.
Figure 11C:
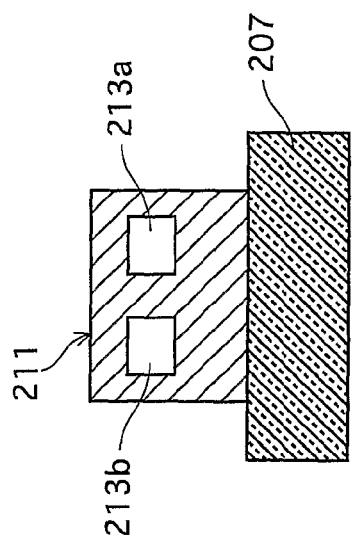
FIG. 11C is a cross sectional view taken along a line Y2-Y2 of FIG. 11A and viewed from a direction as indicated by the arrows nearby.
Figure 11B:
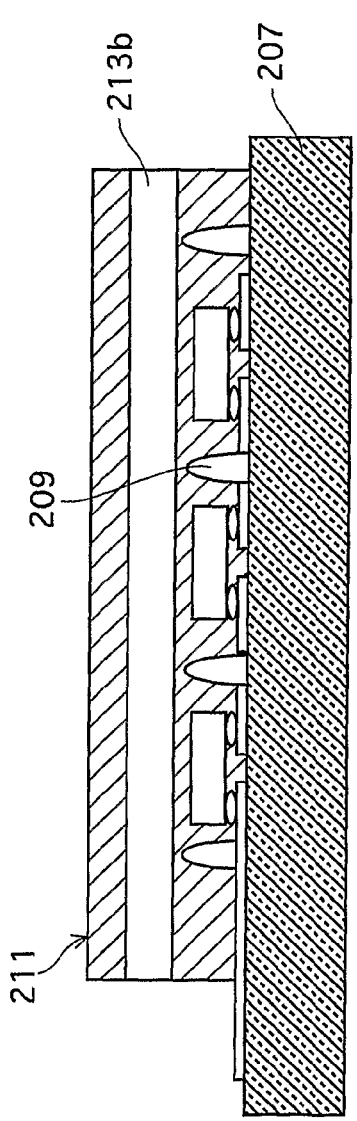
FIG. 11B is a cross sectional view taken along a line X2-X2 of FIG. 11A and viewed from a direction as indicated by the arrows nearby.

FIG. 11A is a cross sectional view of the second modification to the sealing member cut by a plane that is parallel to the substrate. FIG. 11B is a cross sectional view taken along a line X2-X2 of FIG. 11A and viewed from a direction as indicated by the arrows nearby. FIG. 11C is a cross sectional view taken along a line Y2-Y2 of FIG. 11A and viewed from a direction as indicated by the arrows nearby.

Figure 12A:
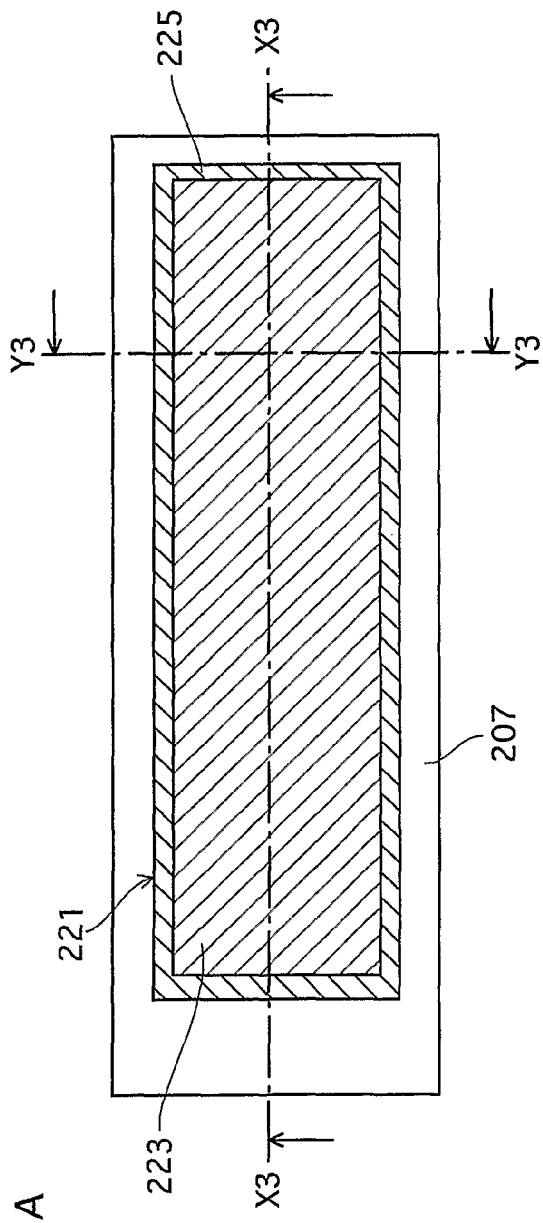
FIG. 12A is a cross sectional view of the third modification to the sealing member cut by a plane that is parallel to the substrate.
Figure 12C:
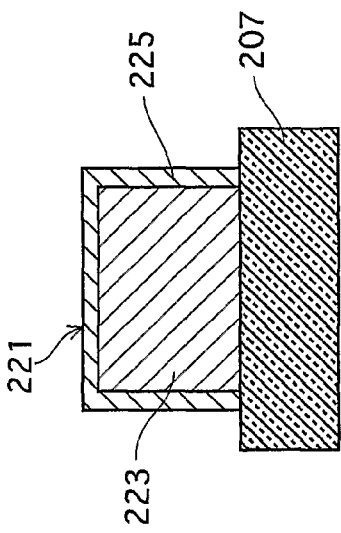
FIG. 12C is a cross sectional view taken along a line Y3-Y3 of FIG. 12A and viewed from a direction as indicated by the arrows.
Figure 12B:
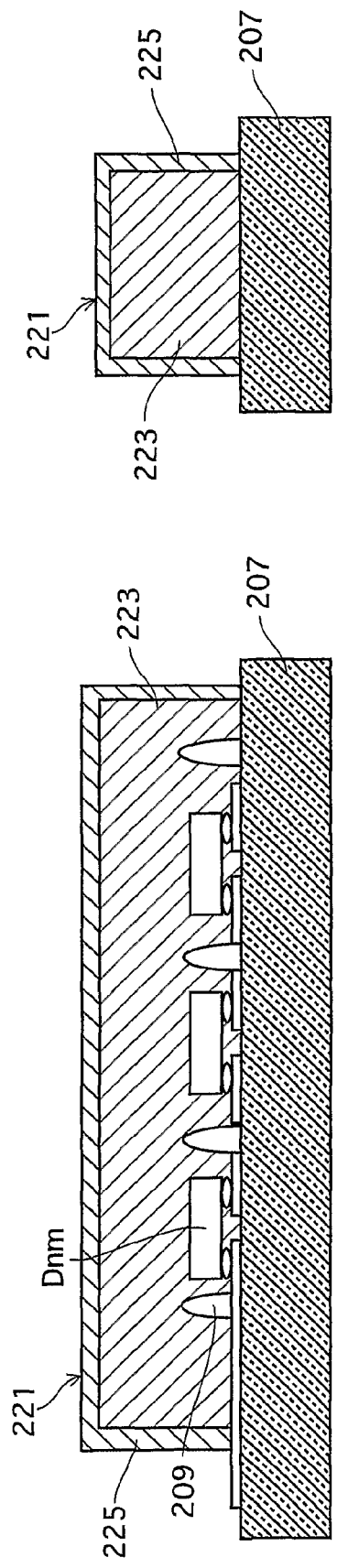
FIG. 12B is a cross sectional view taken along a line X3-X3 of FIG. 12A and viewed from a direction as indicated by the arrows.

FIG. 12A is a cross sectional view of the third modification to the sealing member cut by a plane that is parallel to the substrate. FIG. 12B is a cross sectional view taken along a line X3-X3 of FIG. 12A and viewed from a direction as indicated by the arrows. FIG. 12C is a cross sectional view taken along a line Y3-Y3 of FIG. 12A and viewed from a direction as indicated by the arrows.

A sealing member 201 shown in FIGS. 10A through 10C is in the shape of a rectangular parallelepiped. The sealing member 201 is composed of a sealing member body 202 and a filling 205. The sealing member body 202 has at least one through hole 203 that passes through from one surface of the sealing member 201 to other opposite surface thereof. The filling 205 fills the through hole 203. The filling 205 is made of a material that is translucent and has an excellent heat conductivity, such as ceramic or glass.

The cross sectional shape of the through hole 203 is not limited to a rectangle, but may be in any other shapes such as an ellipse (including a circle), a square, and a polygon. It should be noted here that the sealing member is formed on a substrate 207 on which the semiconductor light emitting elements Dnm have been implemented and heat conductors 209 have been attached.

A sealing member 211 shown in FIGS. 11A through 11C is in the shape of a rectangular parallelepiped. The sealing member 211 has one or more through holes (in this example, two through holes 213a and 213b) that pass through from one surface of the sealing member 211 to other opposite surface thereof. A fluid (for example, water, air, or nitrogen (including liquid nitrogen)) is supplied into the through holes 213a and 213b to be circulated therein. In this case, required are, for example, a pump for sending out the fluid, and pipes for circulating the fluid.

The cross sectional shape of the through holes is not limited to a rectangle, but may be in any other shapes such as an ellipse (including a circle), a square, and a polygon. The through holes need not be formed in the shape of straight pipes, but may be formed in the shape of, for example, bended pipes.

A sealing member 221 shown in FIGS. 12A through 12C is composed of a sealing member body 223 and a cover 225. The sealing member body 223 contains a phosphor. The cover 225 covers an outer surface of the sealing member body 223 so that the outer surface is not exposed to the air. The cover 225 is made of a material that is translucent and has an excellent heat conductivity, such as ceramic or glass. With this structure, the heat accumulated in the phosphor can be released outside through the cover 225.

The sealing member may be any combination of the above-described embodiment and modifications.

5. Substrate

In the above-described embodiment, the substrate is an alumina substrate. However, not limited to this, the substrate may be made of ceramic other than alumina, resin (for example, silicon resin), a material containing glass and epoxy resin, a composite of resin and inorganic filler, metal, or the like.

INDUSTRIAL APPLICABILITY

The present invention can be used as, for example, a light source for a lighting instrument.

The invention claimed is:

1. A light source comprising:
   a substrate;
   semiconductor light emitting elements that have been implemented on a main surface of the substrate to provide emissions of light;
   a translucent sealing member that includes a plurality of phosphor components, for conversion of the light from the light emitting elements to a different color, are provided on the main surface of the substrate to cover and seal the semiconductor light emitting elements; and
   a plurality of separate heat conductors are provided in an array on the main surface of the substrate as projections extending into the translucent sealing member, from the substrate, in an area where the sealing member is provided with phosphor components, such that the heat conductors are positioned to conduct heat from the sealing member, including heat generated by the phosphor components into the substrate.

2. The light source of claim 1, wherein
   the sealing member includes the phosphor and an inorganic material.

3. The light source of claim 1,
   wherein the sealing member includes the phosphor and an organic material.

4. The light source of claim 1, wherein
   the heat conductors are tapered.

5. The light source of claim 1, wherein
   an outer surface of each of the heat conductors is a light reflection surface.

* * * * *